United States Patent
Su et al.

(10) Patent No.: US 9,102,513 B1
(45) Date of Patent: Aug. 11, 2015

(54) MEMS PACKAGE STRUCTURE

(71) Applicant: Himax Display, Inc., Tainan (TW)

(72) Inventors: Chun-Hao Su, Tainan (TW); Roland V. Gelder, Tainan (TW); Tore Nauta, Tainan (TW); Wei-Hsiao Chen, Tainan (TW)

(73) Assignee: Himax Display, Inc., Tainan (TW)

( * ) Notice: Subject to any disclaimer, the term of this patent is extended or adjusted under 35 U.S.C. 154(b) by 0 days.

(21) Appl. No.: 14/167,819

(22) Filed: Jan. 29, 2014

(51) Int. Cl.
| | | |
|---|---|---|
| *H01L 23/02* | (2006.01) | |
| *B81B 7/00* | (2006.01) | |
| *G02B 5/08* | (2006.01) | |
| *G02B 27/00* | (2006.01) | |

(52) U.S. Cl.
CPC .............. *B81B 7/0058* (2013.01); *G02B 5/08* (2013.01); *G02B 27/0006* (2013.01)

(58) Field of Classification Search
None
See application file for complete search history.

(56) References Cited

U.S. PATENT DOCUMENTS

| | | |
|---|---|---|
| 2005/0275075 A1 | 12/2005 | Hong et al. |
| 2009/0115007 A1 | 5/2009 | Hong |
| 2013/0220874 A1* | 8/2013 | Lin et al. .................. 206/701 |

FOREIGN PATENT DOCUMENTS

| | | |
|---|---|---|
| JP | 2006-099065 | 4/2006 |
| JP | 2006-121043 | 5/2006 |
| JP | 2007-019107 | 1/2007 |
| JP | 2008-166837 | 7/2008 |
| JP | 2009-039843 | 2/2009 |
| TW | 200618210 | 6/2006 |
| TW | 200739838 | 10/2007 |
| TW | 200921861 | 5/2009 |
| TW | 201012648 | 4/2010 |
| TW | 201103136 | 1/2011 |

* cited by examiner

*Primary Examiner* — Jack Chen
(74) *Attorney, Agent, or Firm* — J.C. Patents

(57) ABSTRACT

A MEMS package structure including a chip, a MEMS device, a lid, a sealant and a first moisture barrier is provided. The chip comprises an active surface. The MEMS system device is disposed on the active surface. The lid is covered on the chip and comprising a recess, wherein the MEMS device is in the recess. The sealant is disposed between the chip and the lid so as to seal the recess, wherein a thickness of the sealant is less than a height of the MEMS device. The first moisture barrier is sealed around the chip, the sealant and the lid.

10 Claims, 3 Drawing Sheets

MEMS PACKAGE STRUCTURE

BACKGROUND OF THE INVENTION

1. Field of the Invention

The present invention generally relates to a chip package structure. More particularly, the present invention relates to a microelectromechanical system (MEMS) package structure.

2. Description of Related Art

Microelectromechanical system (MEMS) is a microelectromechanical device fabricated in a microminiaturized package structure, and the fabricating technique thereof is quite similar to the technique of fabricating integrated circuits (ICs). However, interactions, for example, about mechanics, optics, or magnetic force between the MEMS device and surrounding environment are more than that of the conventional IC.

The MEMS device may include micro-sized electromechanical components (for example, switches, mirrors, capacitors, accelerometers, sensors, capacitive sensors, or actuators etc.), and the MEMS device may be integrated with the IC in a manner of single block, thereby greatly modifying insertion loss or electrical isolation effect of the overall solid-state device. However, in the macroscopic world of the entire package structure, the MEMS device is extremely fragile and may be impacted by slight static electricity or surface tension at any moment to cause failure. Therefore, in order to prevent the MEMS device from contaminations or damages, usually the MEMS device is sealed in a space between the chip and the lid.

FIG. 1 is a schematic view of a conventional MEMS package structure. Referring to FIG. 1, a conventional MEMS package structure 10 comprises a cover plate 12, a chip 14, a sealant 16 and MEMS devices 18. The cover plate 12 is fixed on the chip 14 with the sealant 16, such that the MEMS devices 18 are sealed in a space between the chip 14 and the cover plate 12.

However, in the conventional MEMS package structure 10, although the space between the chip 14 and the cover plate 12 is sealed by the sealant 16, the sealant 16 may crack and the moisture may permeate into the space between the chip 14 and the cover plate 12 easily after using a period of time in high humidity environment due to a large gap between the cover plate 12 and the chip 14, thereby affecting the normal operation of the MEMS devices 18.

SUMMARY OF THE INVENTION

Accordingly, the present invention is directed to a MEMS package structure which provides better moisture resistance property.

The present invention provides a microelectromechanical system (MEMS) package structure comprising a chip, a MEMS device, a lid, a sealant and a first moisture barrier. The chip comprises an active surface. The MEMS device is disposed on the active surface. The lid covers on the chip and comprising a recess, wherein the MEMS device is in the recess. The sealant is disposed between the chip and the lid so as to seal the recess, wherein a thickness of the sealant is less than a height of the MEMS device. The first moisture barrier is coated around the chip, the sealant and the lid.

According to an embodiment of the present invention, the MEMS package structure further comprises a first substrate, a second substrate and a second moisture barrier. The first substrate has a cavity, wherein the chip, the MEMS device, the lid, the sealant and the first moisture barrier are disposed in the cavity. The second substrate is disposed on the first substrate to cover the cavity. The second moisture barrier is sealed at a boundary zone between the first substrate and the second substrate.

According to an embodiment of the present invention, the MEMS package structure further comprises a molding compound, disposed in the cavity and sealed around the first moisture barrier.

According to an embodiment of the present invention, a projective region of the molding compound formed on the first moisture barrier covers that of the sealant formed on the first moisture barrier.

According to an embodiment of the present invention, the MEMS package structure further comprises a moisture absorption element, disposed in the cavity.

According to an embodiment of the present invention, the second substrate has an area covering the sealant.

According to an embodiment of the present invention, the recess has a top surface opposite to the active surface, and a distance between the top surface and the active surface is larger than mirror tilt height.

According to an embodiment of the present invention, a thickness of the sealant is approximately from 1 micrometer to 10 micrometer.

According to an embodiment of the present invention, the MEMS device comprises a mirror, a switch, a capacitor, an accelerometer, a sensor or an actuator.

According to an embodiment of the present invention, a material of the sealant comprises epoxy resin.

Based on the above-mentioned description, the MEMS package structure of the present invention applies the lid having the recess for accommodating the MEMS device so as to reduce the height of the peripheral gap between the chip and the lid, the sealant disposed between the peripheral gap seals the recess, so that the MEMS package structure of the present invention provides better moisture resistance property. In addition, the first moisture barrier coated around the chip, the lid and the sealant provides a double protection to prevent the moisture from permeating to the recess. Besides, the second moisture barrier provides a third protection to seal the chip, the MEMS device, the lid, the sealant and the first moisture barrier in the cavity enclosed by the first substrate and the second substrate. Moreover, the molding compound disposed in the cavity is glued around the first moisture barrier to provide a fourth protection. Furthermore, the moisture absorption element disposed in the cavity provides a fifth protection to absorb the moisture in the cavity.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
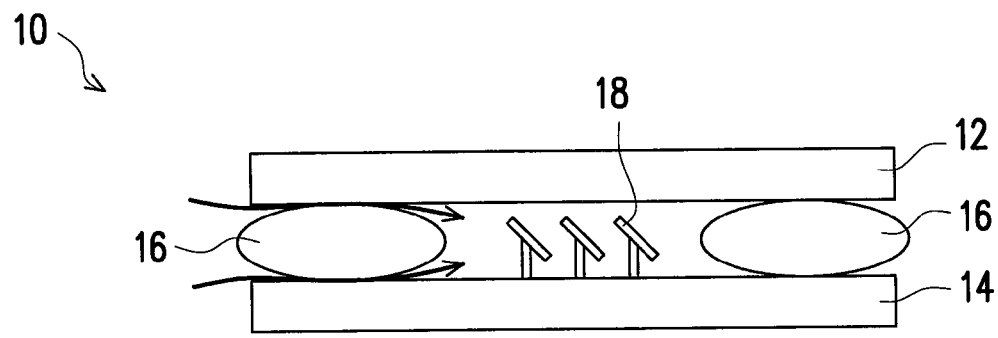
FIG. 1 is a schematic view of a conventional MEMS package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
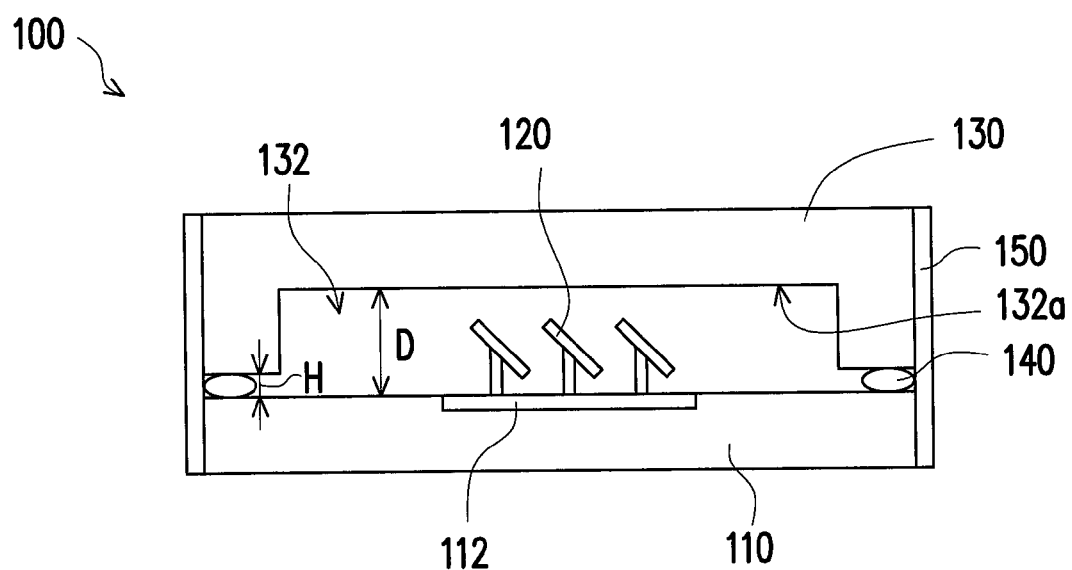
FIG. 2 is a schematic view of a MEMS package structure according to an embodiment of the invention.

FIG. 2 is a schematic view of a MEMS package structure according to an embodiment of the invention. Referring to FIG. 2, a microelectromechanical system (MEMS) package structure 100 of the embodiment comprises a chip 110, at least one MEMS device 120, a lid 130, a sealant 140 and a first moisture barrier 150. The chip 110 comprises an active surface 112. The chip 110 is, for example, an optical sensor chip such as a charge couple device (CCD) or a complementary metal-oxide-semiconductor (CMOS), and the active surface 112 is, for example, a photo sensitive region. But the types of the chip 110 and the active surface 112 are not limited thereto.

The MEMS devices 120 are disposed on the active surface 112. In the embodiment, the MEMS devices 120 are mirrors, but the MEMS devices 120 also can be switches, capacitors, accelerometers, sensors or actuators, the type of the MEMS 120 device is not limited thereto.

The lid 130 is transparent, so that an external light beam (not shown) is capable of passing through the lid 130 to the MEMS devices 120 and the active surface 112 of the chip 110. As shown in FIG. 2, the lid 130 covers on the chip 110 and comprises a recess 132, and the MEMS device 120 is in the recess 132. The recess 132 has a top surface 132a opposite to the active surface 112. In the embodiment, a distance D between the top surface 132a and the active surface 112 is larger than mirror tilt height, for example 10 micrometer, and a height H of a peripheral gap between the chip 110 and the lid 130 is approximately from 1 micrometer to 10 micrometer. That is, the height H of the peripheral gap between the chip 110 and the lid 130 is less than the distance D between the top surface 132a and the active surface 112.

The sealant 140 is disposed at the peripheral gap between the chip 110 and the lid 130 so as to seal the recess 132. As shown in FIG. 2, a thickness of the sealant 140 is less than a height of the MEMS device 120. The thickness of the sealant 140 is limited by the height H of the peripheral gap between the chip 110 and the lid 130. Therefore, the thickness of the sealant 140 is approximately from 1 micrometer to 10 micrometer varied with the height H of the peripheral gap between the chip 110 and the lid 130.

It should be noted that the sealant 140 is an organic polymer compound, for example, an epoxy resin. The molecular structure of the organic compound has many hydrophilic groups, thus having the ability to block the external contamination and moisture, but the molecular structure cannot totally block the reaction of the hydrophilic groups and the moisture. Therefore, in the embodiment, the first moisture barrier 150 is coated around the chip 110, the sealant 140 and the lid 130 so as to effectively block the reaction of the hydrophilic groups of the sealant 140 and the moisture, and further enhance the impermeability of the recess 132. In this manner, the MEMS devices 120 are able to operate normally in the MEMS package structure 100.

In this embodiment, the first moisture barrier 150 can be formed by the chemical vapor deposition (CVD) or physical vapor deposition (PVD) technique, but the forming method of the first moisture barrier 150 is not limited thereto. In addition, a material of the first moisture barrier 150 can be an inorganic insulating material with a higher compaction, for example, silica, silicon nitride, silicon oxynitride, or other nitride, oxide, and oxynitride which do not contain the hydrophilic group, so the moisture resistance of the first moisture barrier 150 is stronger than that of the sealant 140. That is, the inorganic insulating material does not have the hydrophilic group, and will not react with the moisture, thereby effectively isolating the moisture. Hence, the first moisture barrier 150 is able to provide a double protection, so that a permeating probability of the moisture can be lowered.

Comparing to the conventional MEMS package structure 10, the MEMS package structure 100 of the embodiment has the small peripheral gap between the chip 110 and the lid 130, the sealant 140 seals the small peripheral gap between the chip 110 and the lid 130, and the first moisture barrier 150 is coated around the chip 110, the lid 130 and the sealant 140. Therefore, the MEMS package structure 100 of the embodiment provides better moisture resistance property.

Figure 3:
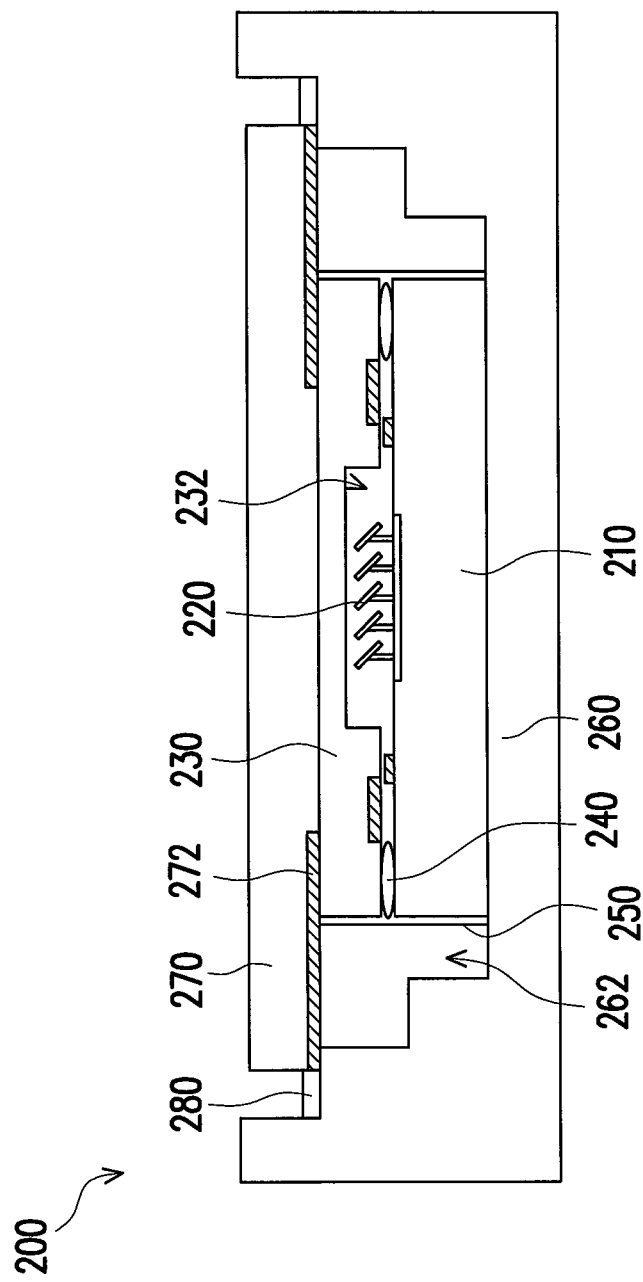
FIG. 3 is a schematic view of a MEMS package structure according to another embodiment of the invention.

FIG. 3 is a schematic view of a MEMS package structure according to another embodiment of the invention. Referring FIG. 3, a difference between a MEMS package structure 200 of the embodiment and the MEMS package structure 100 of the above embodiment is that, the MEMS package structure 200 of the embodiment further comprises a first substrate 260, a second substrate 270 and a second moisture barrier 280. In detail, the first substrate 260 has a cavity 262. A chip 210, a MEMS device 220, a lid 230, a sealant 240 and a first moisture barrier 250 are disposed in the cavity 262. The second substrate 270 is disposed on the first substrate 260 to cover the cavity 262, and the second moisture barrier 280 is sealed at a boundary zone between the first substrate 260 and the second substrate 270.

Hence, in the MEMS package structure 200, the first substrate 260, the second substrate 270 and the second moisture barrier 280 are capable of providing a third protection so as to prevent moisture from permeating to the recess 232 and causing the MEMS devices 220 malfunction.

In addition, in the embodiment, the second substrate 270 is transparent, so that an external light beam (not shown) is capable of passing through. The second substrate 270 has an area 272 covering the sealant 240, and the area 272 is a black area in the embodiment. In other words, a projective region of the area 272 formed on the chip 210 covers a projective region of the sealant 240 formed on the chip 210. Therefore, the area 272 blocks the external light beam from emitting to the sealant 240, so that a degradation probability of the sealant 240 can be lowered.

Figure 4:
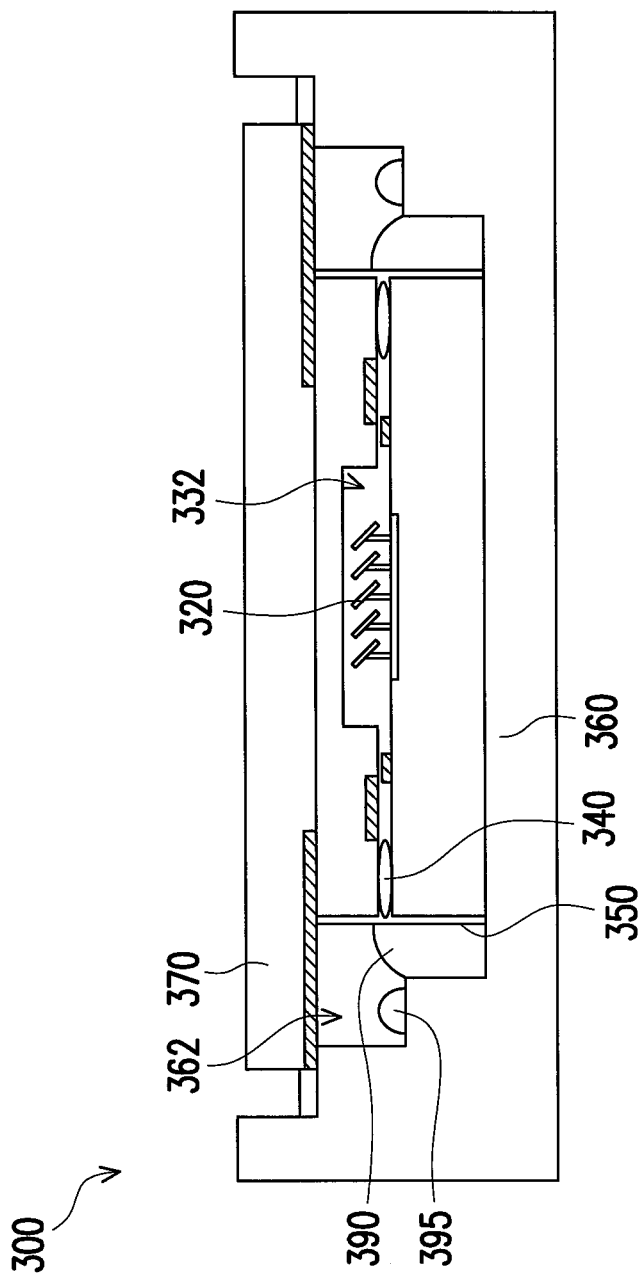
FIG. 4 is a schematic view of a MEMS package structure according to still another embodiment of the invention.

FIG. 4 is a schematic view of a MEMS package structure according to still another embodiment of the invention. Referring FIG. 4, a difference between a MEMS package structure 300 of the embodiment and the MEMS package structure 200 of the above embodiment is that, the MEMS package structure 300 of the embodiment further comprises a molding compound 390 and a moisture absorption element 395. The molding compound 390 is disposed in the cavity 362 and glued around the first moisture barrier 350. As shown in FIG. 4, a projective region of the molding compound 390 formed on the first moisture barrier 350 covers that of the sealant 340 formed on the first moisture barrier 350. That is, the molding compound 390 is able to provide a fourth protection for enhancing the physical structures of the sealant 340 and the first moisture barrier 350 so as to lower the cracking probability of the sealant 340 and the first moisture barrier 350.

Besides, the moisture absorption element 395 is disposed in the cavity 362 enclosed by the first substrate 360 and the second substrate 370 to provide a fifth protection. The moisture permeating to the cavity 362 would be absorbed by the moisture absorption element 395 before entering to the recess 332 so as to keep the MEMS devices 320 operating normally.

In sum, the MEMS package structure of the present invention applies the lid having the recess for accommodating the MEMS device so as to reduce the height of the peripheral gap between the chip and the lid, the sealant disposed between the peripheral gap seals the recess, so that the MEMS package structure of the present invention provides better moisture resistance property. In addition, the first moisture barrier coated around the chip, the lid and the sealant provides the double protection to prevent the moisture from permeating to the recess. Besides, the second moisture barrier provides the third protection to seal the chip, the MEMS device, the lid, the sealant and the first moisture barrier in the cavity enclosed by the first substrate and the second substrate. Moreover, the molding compound disposed in the cavity is glued around the first moisture barrier to provide the fourth protection. Furthermore, the moisture absorption element disposed in the cavity provides the fifth protection to absorb the moisture in the cavity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A microelectromechanical system (MEMS) package structure, comprising:
   a chip, comprising an active surface
   a MEMS device, disposed on the active surface;
   a lid, covered on the chip and comprising a recess, wherein the MEMS device is in the recess;
   a sealant, disposed between the chip and the lid so as to seal the recess, wherein a thickness of the sealant is less than a height of the MEMS device; and
   a first moisture barrier, coated around the chip, the sealant and the lid.

2. The MEMS package structure according to claim 1, further comprising:
   a first substrate, having a cavity, wherein the chip, the MEMS device, the lid, the sealant and the first moisture barrier are disposed in the cavity;
   a second substrate, disposed on the first substrate to cover the cavity; and
   a second moisture barrier, sealed at a boundary zone between the first substrate and the second substrate.

3. The MEMS package structure according to claim 2, further comprising:
   a molding compound, disposed in the cavity and sealed around the first moisture barrier.

4. The MEMS package structure according to claim 3, wherein a projective region of the molding compound formed on the first moisture barrier covers that of the sealant formed on the first moisture barrier.

5. The MEMS package structure according to claim 2, further comprising:
   a moisture absorption element, disposed in the cavity.

6. The MEMS package structure according to claim 2, wherein the second substrate has an area covering the sealant.

7. The MEMS package structure according to claim 1, wherein the recess has a top surface opposite to the active surface, the MEMS device has a mirror, and a distance between the top surface and the active surface is larger than mirror tilt height.

8. The MEMS package structure according to claim 1, wherein a thickness of the sealant is approximately from 1 micrometer to 10 micrometer.

9. The MEMS package structure according to claim 1, wherein the MEMS device comprising a mirror, a switch, a capacitor, an accelerometer, a sensor or an actuator.

10. The MEMS package structure according to claim 1, wherein a material of the sealant comprises epoxy resin.

* * * * *